(12) United States Patent
Bao

(10) Patent No.: US 6,969,634 B2
(45) Date of Patent: Nov. 29, 2005

(54) SEMICONDUCTOR LAYERS WITH ROUGHNESS PATTERNING

(75) Inventor: Zhenan Bao, Millburn, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 43 days.

(21) Appl. No.: 10/669,780

(22) Filed: Sep. 24, 2003

(65) Prior Publication Data

US 2005/0064623 A1    Mar. 24, 2005

(51) Int. Cl.[7] .......................... H01L 51/40; H01L 51/00
(52) U.S. Cl. .......................... 438/99; 438/780; 438/22; 438/82; 438/149; 257/40; 257/72; 257/410; 257/411; 257/289; 257/295; 257/310
(58) Field of Search .......................... 438/99, 901, 780, 438/22, 82, 149; 257/40, 72, 410, 411, 289, 257/295, 310, 59

(56) References Cited

U.S. PATENT DOCUMENTS

| | | | |
|---|---|---|---|
| 5,596,208 A * | 1/1997 | Dodabalapur et al. ........ 257/66 |
| 5,705,826 A * | 1/1998 | Aratani et al. ................ 257/40 |
| 6,344,660 B1 * | 2/2002 | Dimitrakopoulos et al. .. 257/40 |
| 6,344,662 B1 * | 2/2002 | Dimitrakopoulos et al. .. 257/40 |
| 6,403,397 B1 | 6/2002 | Katz ........................... 438/99 |
| 6,413,790 B1 * | 7/2002 | Duthaler et al. .............. 438/21 |
| 6,498,114 B1 * | 12/2002 | Amundson et al. ......... 438/780 |
| 6,596,569 B1 | 7/2003 | Bao et al. .................... 438/151 |
| 6,740,900 B2 * | 5/2004 | Hirai ........................... 257/40 |
| 6,768,132 B2 * | 7/2004 | Smith et al. .................. 257/40 |
| 2003/0062635 A1 | 4/2003 | Stutzmann et al. .......... 264/1.7 |
| 2003/0068519 A1 * | 4/2003 | Brewer et al. ............... 428/620 |
| 2004/0124416 A1 * | 7/2004 | Knipp et al. ................. 257/72 |
| 2004/0212042 A1 * | 10/2004 | Sagisaka et al. ............ 257/552 |

OTHER PUBLICATIONS

Stutzmann, N., et al., "Microcutting Materials on Polymer Substrates," Advanced Functional Materials, vol. 12, No. 2, Feb. 2002, pp. 105-109.

* cited by examiner

Primary Examiner—B. William Baumeister
Assistant Examiner—Igwe U. Anya
(74) Attorney, Agent, or Firm—John F. McCabe

(57) ABSTRACT

A method for making an IC on a surface of a planar substrate includes forming a continuous first layer on the surface of the substrate and pressing a surface of a stamp into the first layer to produce a pattern of non-intersecting smooth regions on the surface. A rough region of the surface of the first layer laterally borders and laterally surrounds each smooth region of the surface of the first layer. The pattern of smooth and rough regions on the surface of the first layer copies a pattern of smooth and rough areas on the surface of the stamp. The method also includes forming a continuous second layer on the patterned first layer. The first layer is one of a dielectric layer and an organic semiconductor layer, and the second layer is the other of a dielectric layer and an organic semiconductor layer.

18 Claims, 5 Drawing Sheets

SEMICONDUCTOR LAYERS WITH ROUGHNESS PATTERNING

The U.S. Government has a paid-up license in this invention and the right in limited circumstances to require the patent owner to license others on reasonable terms as provided for by the terms of Advanced Technology Program Cooperative Agreement No. 70NANB2H3032 awarded by the National Institute of Standards and Technology.

BACKGROUND

1. Field of the Invention

This invention relates to organic semiconductor devices and to methods for making such devices.

2. Description of the Related Art

Many electronic applications require complex circuits with many active semiconductor devices. Advances in the fabrication of complex integrated circuits (ICs) have become possible through the development of technologies for making and using complex masks to etch thin films. In inorganic technologies, mask-controlled etching enables the fabrication of a complex pattern of physically disjoint inorganic semiconductor regions from an initially continuous thin film of the semiconductor. From the disjoint semiconductor regions, separate active semiconductor devices are constructed.

In organic technologies, masks and etching have not been as successful in advancing the fabrication of complex ICs. In particular, mask-controlled etches have not produced fine patterns of some desirable organic semiconductors from thin films. For example, pentacene has desirable electrical properties, because pentacene-based. FETs typically have high ON/OFF current ratios and active channels with high mobilities. Nevertheless, mask-controlled etching techniques have not been very successful in dividing thin pentacene films into fine patterns of disjoint regions. Such processes either have degraded the pentacene films or have not been cost effective. For that reason, pentacene has limited usefulness in organic ICs, i.e., thin film ICs. It would be desirable to incorporate such desirable organic semiconductors into thin film ICs.

SUMMARY

Various embodiments provide integrated circuits (ICs) in which multiple active organic semiconductor regions are formed in a single organic semiconductor layer without etching the layer into physically non-intersecting portions. Rather, surface roughness pattern on the semiconductor layer or an adjacent dielectric layer produces different active semiconductor regions that are electrically isolated from each other. The surface roughness produces a conductivity patterning that electrically isolates the various active semiconductor regions.

One embodiment features a method for making an IC on a surface of a planar substrate. The method includes forming a continuous first layer on the surface of the substrate and pressing a surface of a stamp into the first layer to produce a pattern of non-intersecting smooth regions on the surface and then, forming a continuous second layer on the patterned first layer. A rough region of the surface of the first layer laterally borders and laterally surrounds each smooth region of the surface of the first layer. The pattern of smooth and rough regions on the surface of the first layer copies a pattern of smooth and rough areas on the surface of the stamp. The first layer is one of a dielectric layer and an organic semiconductor layer, and the second layer is the other of a dielectric layer and an organic semiconductor layer.

Another embodiment features an IC. The IC includes a substrate with a planar surface, a continuous first layer whose surface has a plurality of non-intersecting smooth regions, and a continuous second layer located on the same surface of the first layer having the smooth and rough regions. A rough region of the surface of the first layer laterally borders and laterally surrounds each smooth region. One of the layers is a dielectric; and the other of the layers is an organic semiconductor. First portions and second portions of the layer of organic semiconductor are located facing the smooth regions and rough regions, respectively. The first portions have substantially higher conductivities in a direction along the layers than second portions.

BRIEF DESCRIPTION OF THE DRAWINGS

In the Figures and text, like reference numbers indicate features with similar functions or properties.

DETAILED DESCRIPTION OF EMBODIMENTS

The inventor has realized that surface roughness could be used to pattern an organic semiconductor layer into separated conductive regions without physically dividing the layer into non-intersecting pieces. For this reason, some embodiments are able to use organic semiconductors with desirable dielectric properties even if thin layers of the semiconductors are not readily etched into fine features.

Figure 1:
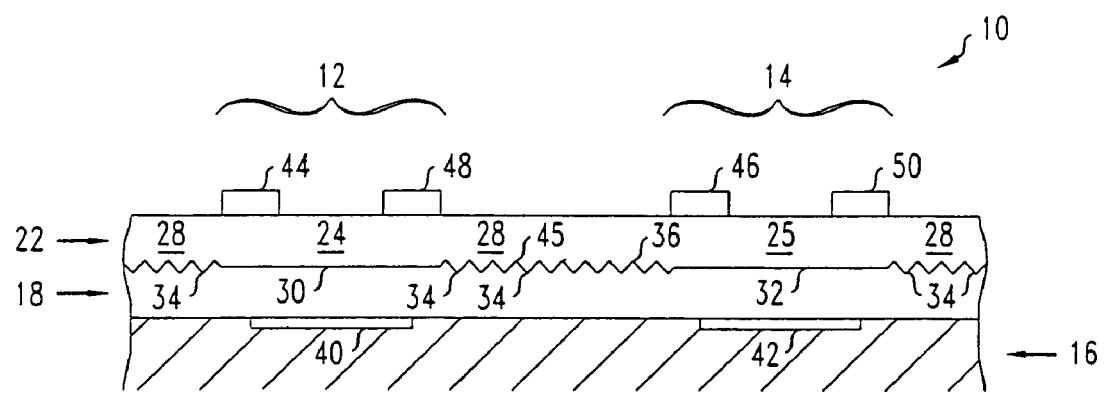
FIG. 1 shows a cross-sectional view of a portion of an integrated circuit (IC) in which multiple organic field-effect-transistors (OFET) are made from a continuous semiconductor film.

FIG. 1 shows a lateral portion of an IC 10. The IC 10 includes multiple thin film OFETs 12, 14, which are located along a planar top surface of a semiconductor or dielectric substrate 16. Exemplary substrates 16 include substrates of silica-glass, silicon, or lightweight/flexible plastics. The IC 10 includes a continuous dielectric layer 18 located on the top surface of the substrate 16 and a continuous organic semiconductor layer 22 located on the dielectric layer 18 so that the two layers 18, 22 form a vertical stack. Exemplary materials for dielectric layer 18 include inorganic dielectrics, moldable dielectric polymers, and self-assembling dielectric multilayers. The organic semiconductor layer 22 may be made of a material deposited from vapor or solution or laminated to the dielectric layer 18 and may or may not formed of a material that is etchable to produce fine features. Exemplary materials for the organic semiconductor layer 22 include pentacene, oligothiophene, oligofluorene, regioregular poly(3-hexylthiophene), α-sexithiophene, and derivatives of these compounds.

The organic semiconductor layer 22 includes conductive lateral portions 24, 26 and non-conductive lateral portion 28. The non-conductive lateral portion 28 provides electrical isolation between the two conductive portions 24, 26 and also electrically isolates the conductive portions 24, 26 from other lateral conductive portions (not shown) in the same semiconductor layer 22. The conductive portions 24, 26 face vertically bordering smooth regions 30, 32 of the top surface 36 of the adjacent dielectric layer 18. The non-conductive portion 28 faces vertically bordering rough regions 34 of the top surface 36 of the adjacent dielectric layer 18. The surface relief of the nonconductive portion 28 may or may not be a copy of the surface relief of physically bordering, rough regions 34 of the top surface 36 of the dielectric layer 18. Nevertheless, the roughness or smoothness of the top surface 36 determines whether facing portions 24, 26, 28 of the organic semiconductor layer 22 are conductive or non-conductive 17.

In some embodiments, the organic semiconductor layer 22 is polycrystalline and has an average grain size that is at least 10 times smaller in the rough portions 28 than in the smooth portions 24, 26.

Figure 2:
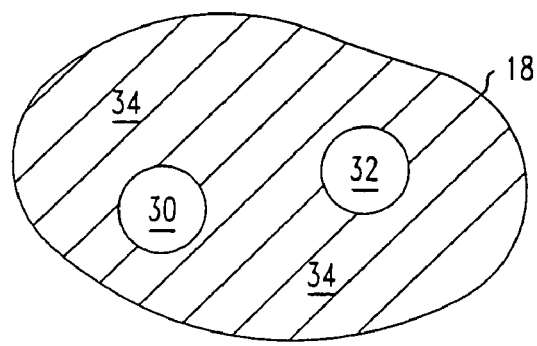
FIG. 2 shows a top view of a roughness-patterned dielectric layer located in the same portion of the IC shown in FIG. 1.

FIG. 2 provides a top view of the same portion of dielectric layer 18 shown in FIG. 1. As the top view shows, each smooth region 30, 32 forms a separate internal hole, i.e., an island, in a rough region 34 of surface 36 of the dielectric layer 18. Thus, the rough region 34 laterally borders and laterally surrounds each of the smooth regions 30, 32 of the dielectric layer 18. For that reason, conductive portions 24, 26 of organic semiconductor layer 22, which face smooth regions 30, 32, are laterally surrounded and laterally separated by non-conductive portion 28 of the semiconductor layer 22. On each smooth regions 30, multiple electronic devices can be fabricated from the continuous semiconductor layer 22 of FIG. 1 and still be laterally electrically isolated from electrical devices on other smooth regions 32.

FIG. 1 shows electrically isolated OFETs 12, 14, which are fabricated from conductive portions 24, 26 of the continuous organic semiconductor layer 22. Each OFET 12, 14 includes a triplet of associated electrodes (40, 44, 48) and (42, 46, 50). Exemplary materials for the electrodes 40–50 include metals such as platinum (Pt), palladium (Pd), silver (Ag), copper (Cu), and gold (Au); conducting polymers such as polyaniline and polythiophene; and conducting pastes such as silver epoxy paste and graphite paste. Each triplet includes a gate electrode 40, 42; a source electrode 44, 46; and a drain electrode 48, 50. The OFETs 12, 14 have active organic semiconductor channels that are fabricated from the conductive portions 24, 26 of the single continuous organic semiconductor layer 22. The OFETs 12, 14 also include gate dielectric structures formed, in part, from smooth regions of the dielectric layer 18. In some embodiments, the gate dielectric structures also include a second dielectric layer (not shown) located between the roughness-patterned dielectric layer 18 and the gate electrodes 40, 42.

The rough regions 34 are constructed to have a roughness suitable for producing the high resistivities that are desired for non-conductive portions 28 of organic semiconductor layer 22. Preferably, the rough regions 34 have thicknesses that are about 0.2 or more times the thickness of the nearby portions 28 of the organic semiconductor layer 22. Here, the thickness of a rough surface area is the vertical distance between highest peaks and lowest valleys on the surface area. Preferably, in the rough regions 34, the roughness density as measured by average lateral distances between adjacent peaks 45 is less than the vertical distance between the highest peaks and lowest valleys. For example, if organic semiconductor layer 22 is 50 nanometers (nm) thick, the adjacent rough region 34 should have a maximum peak-to-valley height of 10 nm or more and an average adjacent peak-to-peak separation of 10 nm or less.

Figure 3:
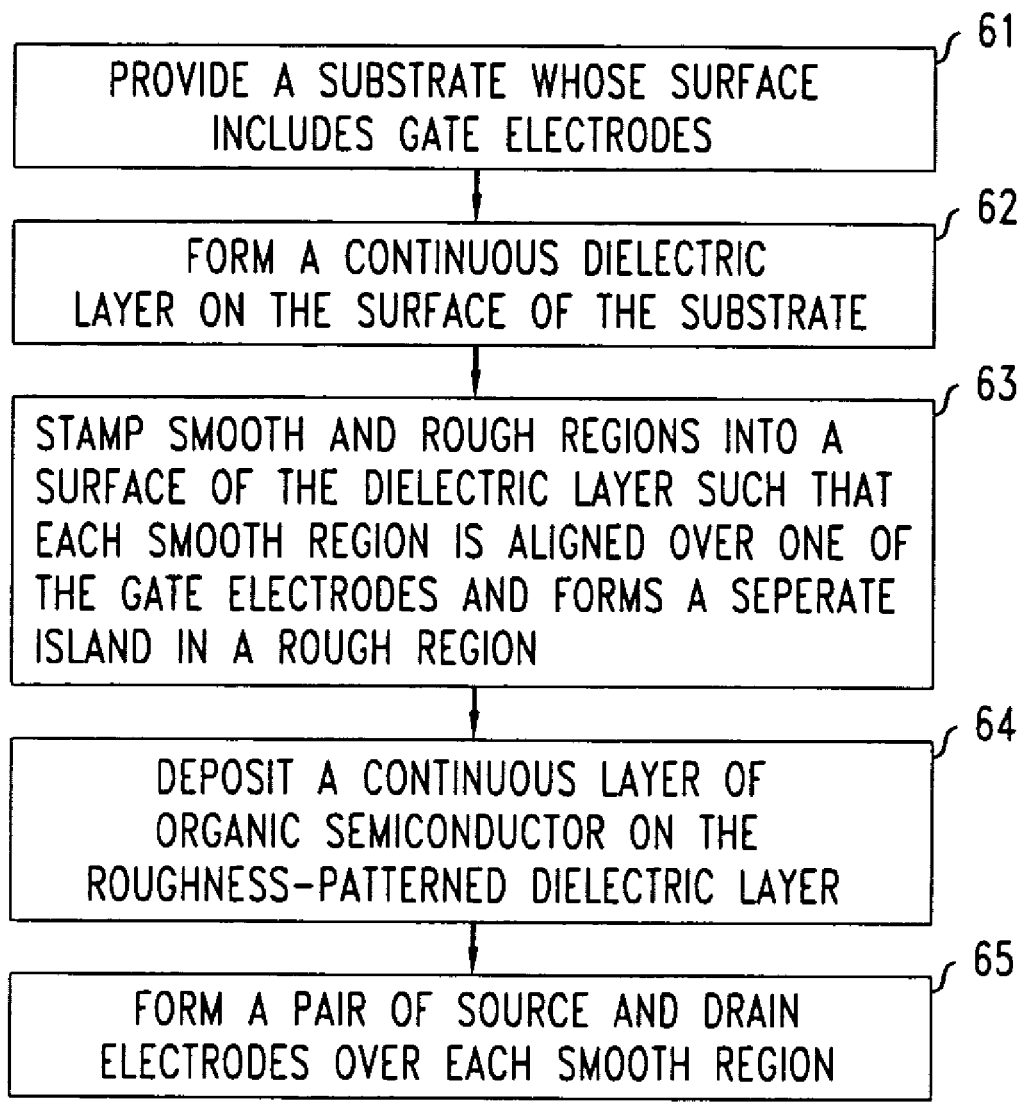
FIG. 3 is a flow chart for a method of fabricating an IC similar to the IC of FIG. 1.
Figure 4:
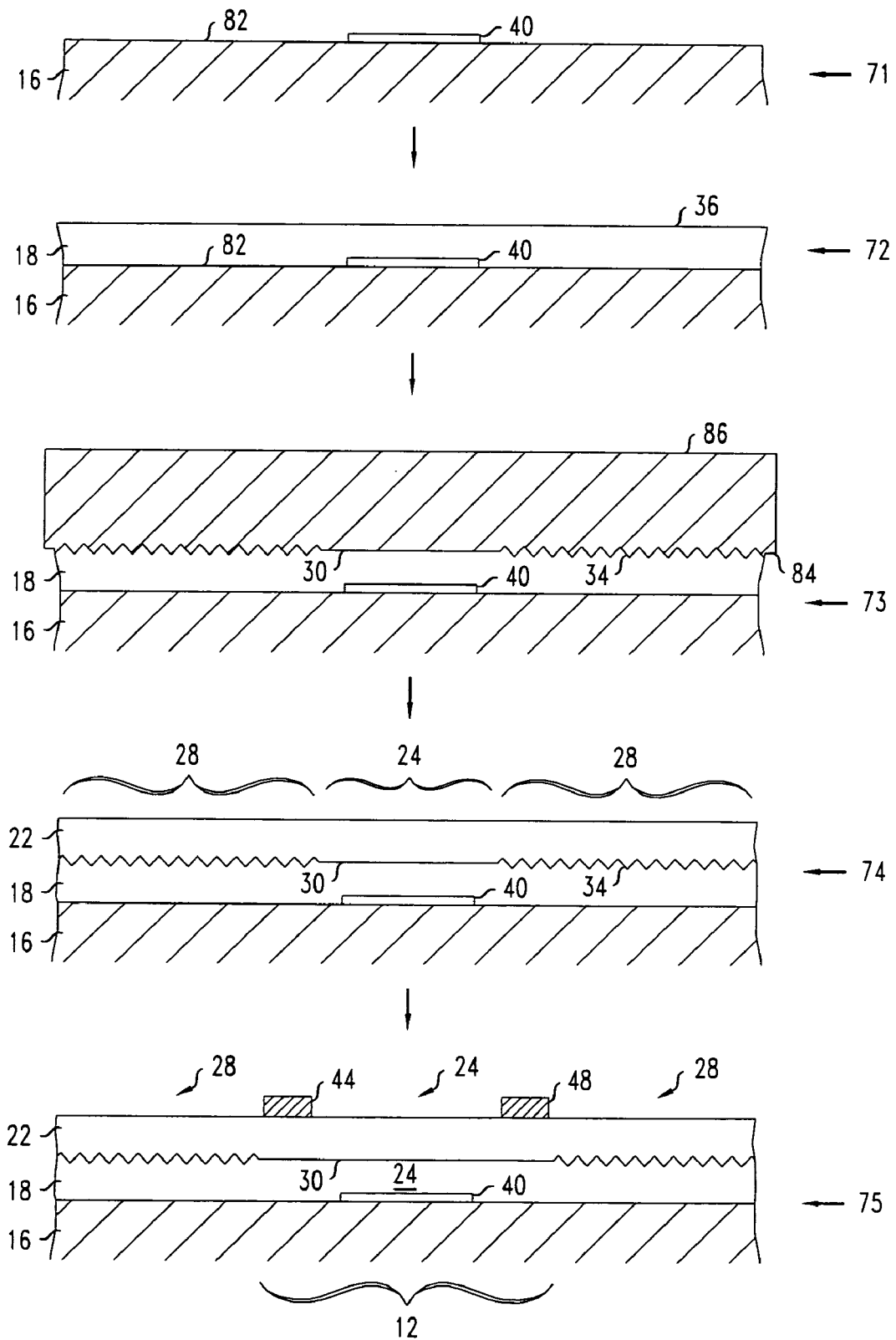
FIG. 4 provides cross-sectional views of structures made by steps of the fabrication method of FIG. 3.

FIG. 3 illustrates one method 60 for fabricating an IC in which multiple OFETs share a continuous organic semiconductor layer, e.g., as shown in FIG. 1. The steps of the method 60 produce structures 71–75, which are shown in FIG. 4.

The method 60 includes providing a dielectric or semiconductor substrate 16 with a planar top surface 82 and a plurality of gate electrodes 40 located on the top surface 82 as in structure 71 (step 24). Exemplary substrates 100 include inorganic materials such as silicon, silica glass, or organic polymers that are lightweight and/or flexible. Fabrication of the gate electrodes 40 on top surface 82 includes performing a mask-controlled evaporation deposition of a metal such as aluminum (Al), copper (Cu), nickel (Ni), or gold (Au) or a metallic alloy such as titanium/palladium/gold (TiPdAu), titanium/platinum/gold (TiPtAu), tantalum nitride ($TaN_x$), or titanium nitride ($TiN_x$) or printing a conductive polymer such as polyaniline.

The method 60 includes forming continuous dielectric layer 18 on planar top surface 82 of substrate 16 to produce structure 72 (step 62). The dielectric layer 18 has a uniform thickness and a smooth planar top surface 36. Exemplary dielectric layers 18 include polymer layers and self-assembling molecular multilayers. Forming such polymer layers or self-assembling molecular multilayers involves performing a conventional solution deposition, a dip-coating deposition, or a spin-coating deposition. A heating or irradiation step preferably cures such polymer layers to produce crosslinking therein if the dielectric layer 18 is to be a base for a subsequent solution-deposition of an organic semiconductor.

The method 60 includes roughness patterning the top surface 36 of continuous dielectric layer 18 to produce structure 73 (step 63). The roughness patterning produces a pattern of smooth and rough surface regions 30, 34 on the top surface 36. The roughness-patterning aligns a separate smooth region 30 over each gate electrode 40. The roughness-patterning also insures that each smooth region 30 is a separate island in one rough surface region 34 so that that the rough region 34 laterally surrounds the bordering smooth region 30.

Producing the roughness patterning includes physically surface-softened dielectric layer 18, pressing a roughness-patterned surface 84 of a stamp 86 into the surface-softened dielectric layer 18, re-hardening the dielectric layer 18, and then, removing the stamp 86 from the re-hardened dielectric layer 18. The surface-softening substep involves heating the dielectric layer 18 or partially dissolving the surface 36 of the dielectric layer 18 with a solvent, e.g., a solvent that inks the surface 84 of the stamp 86. In the surface-softened dielectric layer 18, the pressure of the features on the stamp's surface 84 redistribute molecules to produce the pattern of the smooth and rough regions 30, 34. The pattern is a copy of a corresponding pattern on the surface 84 of the stamp 86. The pressing substep pushes features on the stamp's surface 84 into the dielectric layer 18 to a depth that is either less than or greater than the thickness of the dielectric layer 18. In the later case, the pressing step produces micro-cuts arrays of peaks and valleys into the dielectric layer 18 thereby roughening the dielectric layer 18. Techniques and stamps 86 for micro-cutting arrays of peaks and valleys into thin films are described in U.S. Patent Application Publication No. 2003/0062635, filed Aug. 16, 2002 by Natalie Stutzmann et al, which is incorporated herein by reference in its entirety. The re-hardening substep involves re-cooling the dielectric layer 18, evaporating solvent used to soften the dielectric layer 18, or crosslinking of polymers in the dielectric layer 18 by exposure to heat or ultraviolet radiation. In embodiments based on solvent-induced softening, the stamp 86 may have pores that facilitate evaporation of solvent from the top surface 36. After re-hardening and removal of the stamp 86, the top surface 36 has a roughness pattern that is a negative copy of the roughness-pattern on the stamp's surface 84.

For the roughness-patterning step, appropriate stamps 86 include roughness-patterned hard stamps and polymer replicas of such hard stamps. Various processes are available for making roughness-patterned hard stamps. One process involves performing a mask-controlled etch of a planar surface of a silicon substrate to produce a pattern of rough areas thereon. Etch conditions that roughen silicon surfaces are well-known to those of skill in the art. Another process involves performing an electro-chemical etch to produce porous regions on a planar surface of a silicon substrate. The porous regions form the rough areas of the stamp. Another process involves growing a rough polycrystalline film on a planar surface of a substrate, e.g., growing a barium tantalate film, e.g., $Ba_3Ta_5O_{15}$, on a silicon substrate. Growing the film under the control of a lithographically produced mask produces a pattern of rough regions of polycrystalline growth for appropriately selected deposition rates, substrate temperatures, and/or surface treatments. Another process involves performing a mask-controlled deposition of $TiO_2$ or $Al_2O_3$ particles on a planar surface of a silicon or $SiO_2$ substrate to form a particle pattern thereon. The particles have diameters in the 1 nm to tens of nm range, and the rough areas of the stamp correspond to regions where the particles are deposited. One process for producing a polymer replica stamp involves coating a hard stamp with a precursor mixture for an elastomer such as polydimethylsiloxane (PDMS), curing the mixture to form a cross-linked elastomer, e.g., via exposure to ultraviolet light, and then, pealing the cured elastomeric replica off the hard stamp.

The method 60 includes depositing a continuous organic semiconductor layer 22, e.g., to a thickness of about 50 nm to about 100 nm, on the roughness-patterned surface 36 of dielectric layer 18 thereby producing structure 74 (step 64). The deposition may involve vapor or solution depositing the organic semiconductor or spin-coating the organic semiconductor on the surface of roughness-patterned dielectric layer 18. An exemplary vapor deposition includes heating a boat containing pentacene to greater than 200° C. in a vacuum container maintained at a pressure of about $10^{-5}$ Torr or less thereby causing an evaporation-deposition of the pentacene on the surface 36. An exemplary spin-coating includes forming a solution of about 1 milligram of regioregular poly(3-hexylthiophene) in a milliliter of chloroform, coating the roughness-patterned surface 36 with a portion of the solution, and spinning the surface 36 at about 1,000 rounds per minute to form a thin film thereon. The deposition of semiconductor on the roughness-patterned dielectric layer 18 produces a corresponding pattern of smooth and rough regions 30, 34 on the surface of the resulting organic semiconductor layer 22.

Portions 28 of organic semiconductor layer 22 that vertically border rough surface regions 34 of dielectric layer 18 have substantially higher in-layer resistivities than portions 24 of the organic semiconductor 22 that vertically border smooth surface regions 30 of the dielectric layer 18. The roughness-patterning is selected so that the ratio of the final resistivity per unit surface length for the more resistive portions 28 of the organic semiconductor layer 22 to the resistivity of the less resistive portions 24 is 10 or more and is preferably is 100 or more. Such high resistivity ratios insure that different smooth portions 24 of the semiconductor layer 22 will be electrically isolated from each other. The deposition preferably produces a thickness for the organic semiconductor layer 22 that is less than or equal to five times the maximum peak-to-valley height in rough regions 34 of the dielectric layer 18.

The method 60 includes forming a pair of source and drain electrodes 44, 48 on organic semiconductor layer 22 over each smooth surface region 30 as shown in IC 75 (step 65). Exemplary forming steps include performing an evaporation-deposition of a metal or a metal alloy, printing a conductive polymer as described with respect to fabrication of gate electrode 40, or laminating a separate structure for a source and drain electrodes to the top surface of organic semiconductor layer 22. Aligning the pair of drain and source electrodes 44, 48 over a smooth region 30 ensures that the semiconductor channel physically connecting the electrodes 44, 48 is one of the less resistive portions 24 of the organic semiconductor layer 22. This alignment also ensures that an associated gate electrode 40 is positioned to control the conductivity of the organic semiconductor channel during operation of OFET 12.

The method 60 may include further conventional processing steps to form protective covering dielectric layers, metallic interconnect layers, and contacts for electrodes 40, 44, 46 of OFET 12 and of other devices on IC's substrate 16.

Figure 5:
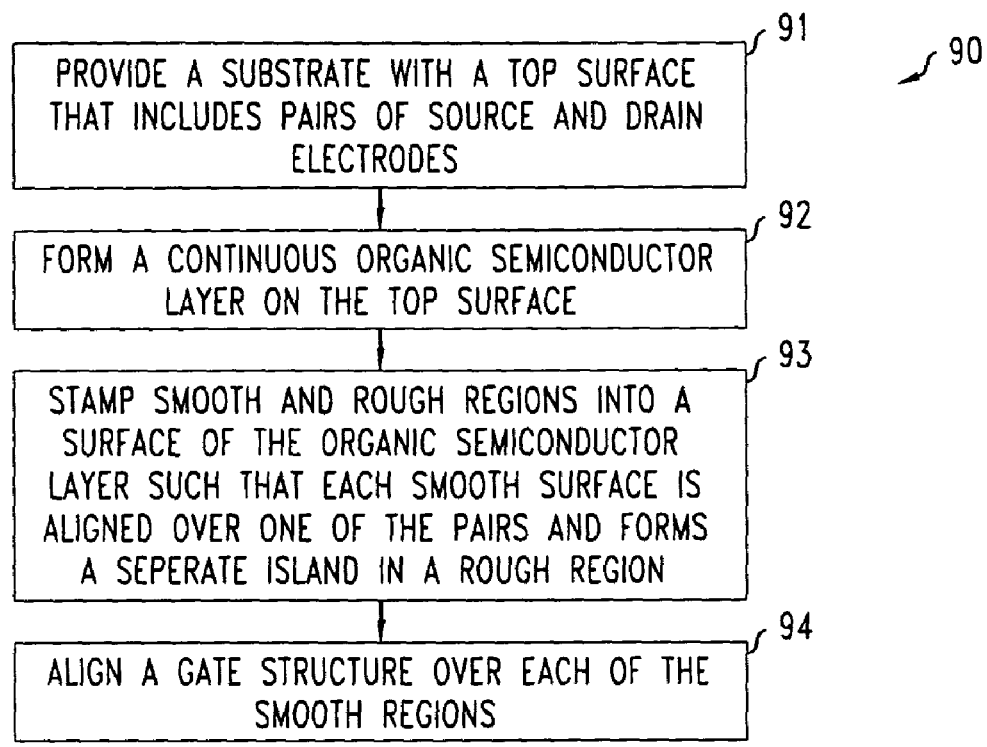
FIG. 5 is a flow chart for an alternate method for fabricating an IC.

FIG. 5 illustrates a lamination method 90 for fabricating an IC in which roughness-patterning of a single organic semiconductor layer produces electrical isolation between active devices that share the same semiconductor layer. The steps of method 90 produce structures 121–125 shown in FIG. 6.

The method 90 includes providing a dielectric or semiconductor substrate 100 whose planar top surface 102 includes pairs of source and drain electrodes 44, 48 like the pair shown in structure 121 (step 91). Exemplary substrates 100 include inorganic materials or flexible polymers that are suitable for reel-to-reel processing. Fabrication of electrodes 44, 48 involves performing an evaporation-deposition of a metal, e.g., Al, Cu, Ni, or Au, or a metallic alloy, e.g., PdAu, AuBe, or $TaN_x$, or printing a conducting polymer such as polyaniline.

The method 90 includes forming a continuous organic semiconductor layer 22 on the top surface 102 of substrate 100 (step 92). The continuous semiconductor layer 22 has a uniform thickness and a smooth top surface 106 as shown in structure 122. The forming step 92 involves solution or vapor depositing the organic semiconductor on the top surface 102 or spin-coating the organic semiconductor on the top surface 102. The organic semiconductor layer 22 is a thin continuous polycrystalline film, e.g., a film of regioregular poly(3-hexylthiophene) or pentacene.

The method 90 includes roughness-patterning top surface 106 of continuous organic semiconductor layer 22 (step 93). The roughness-patterning step includes surface-softening the organic semiconductor layer 22, pressing a roughness-patterned stamp's surface 84 into the softened organic semiconductor layer 22, re-hardening the semiconductor layer 22, and then, removing the stamp 86 from the semiconductor layer 22. For such roughness-patterning, suitable stamps 86 have been described with respect to step 63 in method 60 of FIG. 3. Similarly, suitable processes for the above surface-softening, pressing, and re-hardening sub-steps are also described with respect to above step 63 for roughness-patterning dielectric layer 18 in step 63. The roughness-patterning produces a pattern of smooth and rough regions 30, 34 in the top surface 106 of the organic semiconductor layer 22. The roughness-patterning aligns a separate smooth region 30 over each pair of source and drain electrodes 44, 48. Furthermore, the roughness-patterning causes each smooth region 30 to form a separate island in one of the rough regions 34. Thus, the rough surface region 34 laterally surrounds a bordering smooth surface region 30 thereby isolating the smooth surface region 34 from other smooth surface regions on the surface 106.

While pressing the stamp 86 into the organic semiconductor, pressure, heat or solvent inking the stamp 86 softens the top surface 106. For that reason, pressure from the stamp 86 is able to redistribute the organic semiconductor in the top surface 106 thereby forming a pattern of smooth and rough surface regions 30, 34. The pattern formed by the surface regions 30, 34 is a negative copy of a pattern of smooth and rough regions on the patterned surface 84 of the stamp 86. Cooling or solvent evaporation re-hardens the semiconductor layer 22 and solidify the roughness-pattern prior to removal of the stamp 86 from the organic semiconductor layer 22.

The roughness-patterning aligns a portion 24 of the organic semiconductor layer 22, which borders a smooth surface region 30, over each pair of source and drain electrodes 44, 48. Thus, the relatively low resistivity portions 24 of the organic semiconductor layer 22 form active semiconductor channels of OFETs. Furthermore, each active semiconductor channel is separated from other active channels (not shown) by a barrier formed of a high resistivity portion 28 of the organic semiconductor layer 22, i.e., located adjacent a rough surface region 34.

The method 90 also includes forming gate structures 104 over each of the smooth regions 30 to produce an IC 125 in which multiple OFETs 12 share the same continuous organic semiconductor layer 22 (step 94). Various processes are available for forming the gate structures 104.

A first process involves fabricating gate structures 104 on a flexible substrate 16 and then, physically laminating the gate structures 104 to roughness-patterned structure 124 to produce IC 125. Processes that use physical lamination to fabricate ICs are described in U.S. Pat. No. 6,596,569 ('569) of Zhenan Bao et al, issued Jul. 22, 2003, which is incorporated herein by reference in its entirety. Suitable flexible substrates 16 include flexible polymers of polyethylene, polypropylene, polyimide, polyester, polyacrylate, or PDMS. Fabrication of the gate structures 104 includes forming one or more gate electrodes 40 on the flexible substrate 16, e.g., by evaporation-deposition or a printing process. The one or more gate electrodes 40 are made of one of the metals, metallic alloys, or printable conductive polymers already described with respect to the fabrication of source and drain electrodes 44, 48. Fabrication of the gate structure 104 also includes forming a continuous polymeric dielectric layer 18 on the substrate 104, e.g., by spin coating a liquid polymer precursor and then curing the precursor to cross-link the polymer molecules. To ensure that the laminated structures 104 and 124 remain together, an adhesive layer may be applied to dielectric layer 18 or the organic semiconductor layer 22 prior to lamination. Physical lamination of the gate structure 104 to the structure 124 involves positioning the gate structure 104 to be aligned in front of a portion 24 of organic semiconductor layer 22 that borders a smooth surface region 30. This alignment configures the gate electrode 40 to be able to control the organic semiconductor channel that physically connects a pair of the source and drain electrodes 44, 48. In the final IC 125, gaps may be present between contact surface 106 of the dielectric layer 18 and rough surface regions 34 due to surface roughness.

An alternate second process forms gate structure 104 via a conventional layer-by-layer manner directly on structure 124. The alternate process includes performing a solution or vacuum deposition or a spin-coating and a cure to produce gate dielectric layer 18 on the organic semiconductor layer 22. The alternate process includes forming one or more gate electrodes 40 on the dielectric layer 18 by a process already described with respect to fabrication of source and drain electrodes 44, 48. The forming step aligns the gate electrode 40 over the smooth region 30 so that the final gate electrode 40 is configured to control a low resistivity organic semiconductor channel that physically connects the pair of source and drain electrodes 44, 48. The alternate process may include forming a protective top dielectric layer 16, metallic interconnect layers (not shown), and electrical contacts (not shown) for the various electrodes 40, 44, 48.

In light of the disclosure, it will be obvious to those of skill in the art that the described methods and structures can incorporate other semiconductor devices into the continuous organic semiconductor layer 22, e.g., diodes and light-emitting diodes. Roughness-patterning would laterally isolate those semiconductor devices provided that they are formed from portions of the semiconductor layer that vertically border smooth surface regions and provided that the smooth surface regions are laterally surrounded by laterally bordering rough surface regions of the semiconductor layer.

Figure 6:
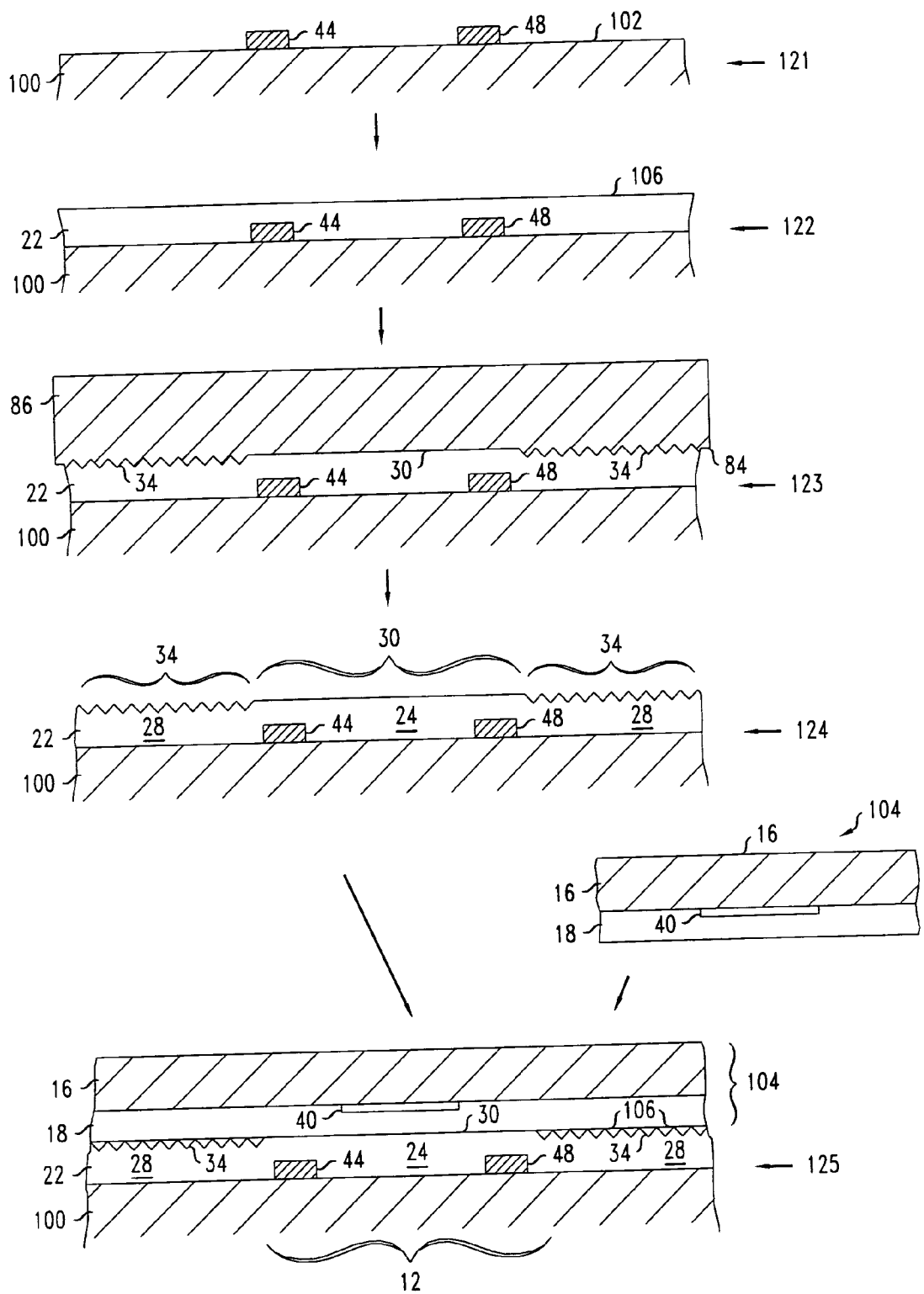
FIG. 6 provides cross-sectional views of structures made by steps of the fabrication method of FIG. 5.

Other techniques and materials known in the art may be used to fabricate various layers and elements of IC 10, shown in FIG. 1, and/or of structures 71–75, 104, 121–125, shown in FIGS. 4 and 6.

Other embodiments of the invention will be apparent to those of skill in the art in light of the specification, drawings, and claims of this application.

What is claimed is:

1. A method for fabricating an integrated circuit on a surface of a planar substrate, comprising:
    forming a continuous first layer on the surface of the substrate, the first layer being one of a dielectric layer and an organic semiconductor layer;
    pressing a surface of a stamp into the first layer to produce a pattern of non-intersecting smooth regions on the surface in the first layer, each smooth region being laterally surrounded by a laterally bordering rough region of the surface of the first layer, the pattern of smooth and rough regions on the surface of the first layer copying a pattern of smooth and rough areas on the surface of the stamp; and
    forming a continuous second layer on the roughness-patterned first layer, the second layer being the other of a dielectric layer and an organic semiconductor layer.

2. The method of claim 1, wherein the smooth regions have diameters of less than about 10 micrometers.

3. The method of claim 2, wherein each of the rough and smooth regions of the surface of the first layer defines an associated lateral portion of the layer comprising organic semiconductor, the associated lateral portion is physically facing the associated region of the surface of the first layer; and
    wherein the lateral portions associated with the rough regions have resistivities in a direction along the layers that are at least 10 time higher than resistivities along the same direction of the lateral portions associated with the smooth regions.

4. The method of claim 1, wherein the pressing micro-cuts arrays of peaks and valleys in the rough regions.

5. The method of claim 1, further comprising:
forming a pattern of gate electrodes; and
wherein each smooth region of the surface of the first layer defines an associated lateral portion of the layer comprising organic semiconductor, the associated lateral portion physically faces the associated smooth region, each of the lateral portions forms an active channel of an organic field-effect transistor, one of the gate electrodes is configured to control the conductivity of each active channel.

6. The method of claim 1, further comprising providing heat to soften the first layer during the act of pressing.

7. The method of claim 1, further comprising inking the stamp with a solvent capable of dissolving material of the first layer; and
wherein the act of pressing comprises pressing an inked surface of the stamp into the first layer.

8. The method of claim 1, wherein the first layer is a dielectric layer and the second layer is a semiconductor layer.

9. The method of claim 8, wherein the act of forming a second layer comprises depositing material for the second layer on the first layer from a vapor or a solution.

10. The method of claim 1, wherein the rough regions have a roughness characterized by a maximum peak-to-valley height of at least 0.2 times the thickness of the layer comprising organic semiconductor.

11. The method of claim 1, wherein the semiconductor includes one of tetracene; pentacene; α-sexithiophene; and a derivative of tetracene, pentacene, or α-sexithiophene.

12. An apparatus, comprising:
a substrate having a planar surface;
a continuous first layer whose surface has a plurality of non-intersecting smooth regions, each smooth region being laterally surrounded by a laterally bordering rough region of the same surface of the first layer,
a continuous second layer located on the same surface of the first layer that has the smooth and rough regions;
wherein one of the layers is a dielectric and the other of the layers is an organic semiconductor; and
wherein first portions of the layer of organic semiconductor have substantially higher conductivities in a direction along the layers than second portions of the layer of organic semiconductor, the first portions of the layer of organic semiconductor being located facing the smooth regions and the second portions of the layer of organic semiconductor being located facing the rough regions.

13. The apparatus of claim 12, further comprising triplets of associated gate, source, and drain electrodes; and
wherein each triplet of electrodes is associated with one of the first portions of the semiconductor layer, each associated first portion being an active semiconductor channel for the associated source and drain electrodes, and each gate electrode being configured to control the conductivity of the associated first portion.

14. The apparatus of claim 13, wherein the first layer is a dielectric.

15. The apparatus of claim 12, wherein the organic semiconductor includes pentacene or tetracene.

16. The apparatus of claim 12, wherein the conductivities of the first portions are at least 10 times higher than those of the second portions.

17. The apparatus of claim 12, wherein the layer of organic semiconductor is polycrystalline and has an average grain size that is at least 10 times smaller in the second portions than in the first portions.

18. The apparatus of claim 12, wherein the rough regions have a roughness characterized by a maximum peak-to-valley height of at least 0.2 times the thickness of the layer comprising organic semiconductor.

* * * * *